(12) United States Patent
Komoike (10) Patent No.: US 6,717,235 B2
(45) Date of Patent: Apr. 6, 2004

(54) SEMICONDUCTOR INTEGRATED CIRCUIT DEVICE HAVING A TEST PATH

(75) Inventor: Tatsunori Komoike, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/190,547

(22) Filed: Jul. 9, 2002

(65) Prior Publication Data

US 2003/0034549 A1 Feb. 20, 2003

(30) Foreign Application Priority Data

Aug. 16, 2001 (JP) ........................................ 2001-247297

(51) Int. Cl.[7] .............................................. H01L 29/00
(52) U.S. Cl. ........................ 257/555; 257/552; 714/726; 714/729; 714/730
(58) Field of Search ................................ 257/555, 552; 365/174, 233, 189, 203; 714/726–730, 736; 438/309, 313, 322, 323; 371/25, 15

(56) References Cited

U.S. PATENT DOCUMENTS 5,485,466 A * 1/1996 Lyon et al. ................. 371/22.3
5,953,285 A * 9/1999 Churchil et al. ............. 365/233

FOREIGN PATENT DOCUMENTS

| JP | 06-163659 |   | 6/1994 |           |
|----|-----------|---|--------|-----------|
| JP | 2000-049202 | * | 2/2000 | ........... H01L/21/66 |

* cited by examiner

Primary Examiner—Carl Whitehead, Jr.
Assistant Examiner—Yennhu B Huynh
(74) Attorney, Agent, or Firm—Burns, Doane, Swecker & Mathis, L.L.P.

(57) ABSTRACT

The invention provides a semiconductor integrated circuit device that includes a combination circuit incorporated in a chip, plural input pads and output pads, and a shift register made up with plural SFFs in which the input pins and output pins of the consecutive SFFs are connected, respectively, to the input pads and the output pads directly or via the combination circuit. In this configuration, the output pads and the input pads are connected to each other inside the chip to thereby form a test path.

8 Claims, 8 Drawing Sheets

3A ⁀ THE NUMBER OF OUTPUT PADS = THE NUMBER OF INPUT PADS

FIG.4

THE NUMBER OF OUTPUT PADS < THE NUMBER OF INPUT PADS

FIG.5

THE NUMBER OF OUTPUT PADS > THE NUMBER OF INPUT PADS

PRIOR ART

SEMICONDUCTOR INTEGRATED CIRCUIT DEVICE HAVING A TEST PATH

BACKGROUND OF THE INVENTION

1. Field of the Invention

The present invention relates to a semiconductor integrated circuit device with logic circuits built-in, specifically to a design for testability for integrated circuits.

2. Description of Related Art

Recently, the scan testing technique has been the trend in the design for testability for logic circuits. Since the test pattern can easily be generated with the use of the substantial automatic test pattern generation tool (ATPG), it is no exaggeration to say that the scan testing technique becomes general in the field of the short-delivery semiconductor circuit device (hereunder, referred to as LSI). However, to leave the generation of test patterns to the ATPG will not always produce good and excellent test patterns.

Here, the ATPG means a software to automatically generate test patterns that enable detection of estimated faults in the nodes of a circuit from the judgment of only the circuit structure, based on the circuit information (in other words, the test patterns that allow controls and observations of 1-to-0 transitions from external terminals). In the present circumstances, it is general to premise that there is one or zero fixed fault in the whole circuit as a fault model (referred to as single stuck-at fault; Stuck-At-0 or Stuck-At-1). However, it is an experimental knowledge that even the test pattern generated by this model detects multiple faults or non-stuck-at faults at a considerable degree. Here, the test pattern generated by this model is generated regardless of the functional meaning of the circuit, and it means a defect check pattern, in distinction from a functional test pattern used for the functional verification of the design.

Next, there is a fault coverage that can be quoted as an indicator to quantitatively represent the quality of a test pattern. This coverage is to represent the degree how far the ATPG test pattern detects the faults estimated in the target circuit. In practice, the test pattern of the high fault coverage by the ATPG requires a considerable time, on the contrary to the strong request for the short delivery time, and there frequently occur situations that lead to reduction of the test pattern within a realistic range, or abandonment of the fault detection in a specific area. With regard to the fault detection in a specific area, a simulation pattern used for a sign-off condition with a customer, or a means to compensate to the best by a newly created pattern is often applied.

On the other hand, a means for testing plural LSIs simultaneously on an inexpensive tester will be often introduced on a mass production for the purpose of further cost reduction. However, an inexpensive tester usually involves the restriction on the number of test pins, which leads to the restriction of the simultaneously measurable number of the LSIs.

Figure 8A:
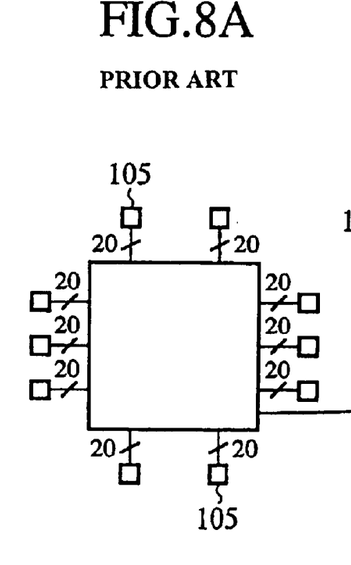
FIGS. 8A and 8B are illustrations of the LSI test system by a conventional tester.
Figure 8B:
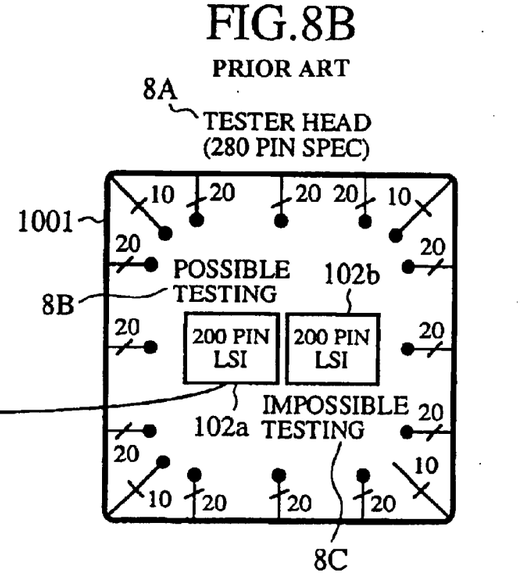
Figure 9A:
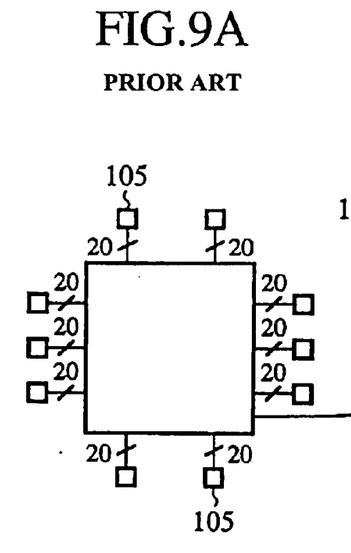
FIGS. 9A and 9B are another illustrations of the LSI test system by the conventional tester.
Figure 9B:
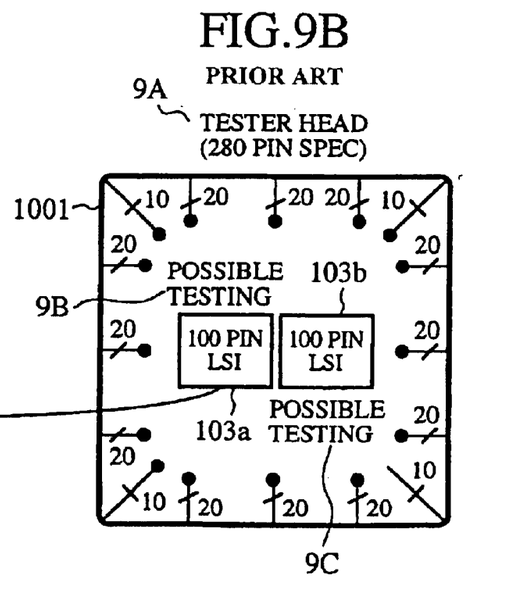

Referring to FIGS. 8A, 8B and FIGS. 9A, 9B, this situation will be described. FIG. 8A and FIG. 9A illustrate the construction of an LSI test system adapted to a conventional tester, and the tester head has 280 pins spec. FIG. 8B and FIG. 9B illustrate the connection of the LSI tester. In the drawings, 1001 denotes the tester head, 102a and 102b denote 200-pin LSIs, 103a and 103b denote 100-pin LSIs, and 105 denotes an LSI interface.

In FIG. 8, simultaneous measurements can be made only within the number of the LSIs that satisfies the relationship: the LSI interface 105 of the tester head 1001≧(the pin number of the LSI)×n (n: the number of the LSIs). Consequently, the LSIs 102a and 102b having 200 pins cannot be measured simultaneously, on the tester having the test pin restriction of 280 pins. This is a very exaggerated case. In case of an LSI having 110 input pins and 90 output pins, for example, two of the LSIs can be measured simultaneously. That is, the input pins should be shared by both of the LSIs. However, the extent to which the simultaneous measurement becomes possible depends upon the rate of the number of the input pins against that of the output pins, but a general standard for this rate is not provided.

In such a case, considering the reduction of the fault coverage within a permissible range, it is conceivable to reduce the pin number of the LSIs that the tester can access to thereby realize the simultaneous measurement. For example, as to the LSI in which the fulfillment of the fault coverage 98% is premised on the condition that all the pins of the 200-pin LSI are accessed, the alteration of the above premise into 90% is presumed approved. And, assuming that the fault coverage 90% can be achieved with the access to 100 pins, the foregoing tester will be able to measure the two 100-pin LSIs 103a and 103b simultaneously (see FIG. 9). In this manner, since the scale of the tester head 1001 is generally small in an inexpensive tester, the arrangement is made to reduce the number of the pins requiring the access for testing within a range that the lowering in the fault coverage is permitted, whereby the simultaneous measurement is achieved by treating the number of the LSI pins apparently fewer. Here, the 100-pin LSI means one that, although it is originally the 200-pin LSI, is treated as a 100-pin LSI at the sacrifice of the capability of controls and observations.

Figure 10A:
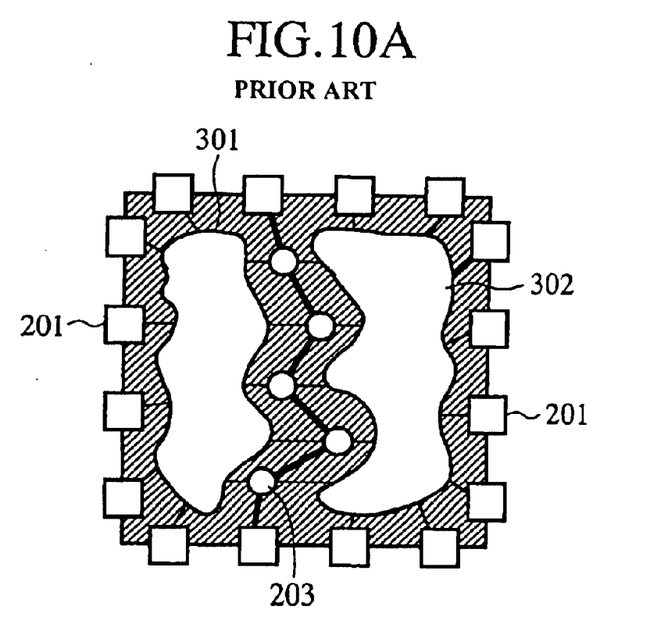
FIGS. 10A and 10B each are a chart illustrating the comparison of areas where the fault detections by the conventional system are abandoned.
Figure 10B:
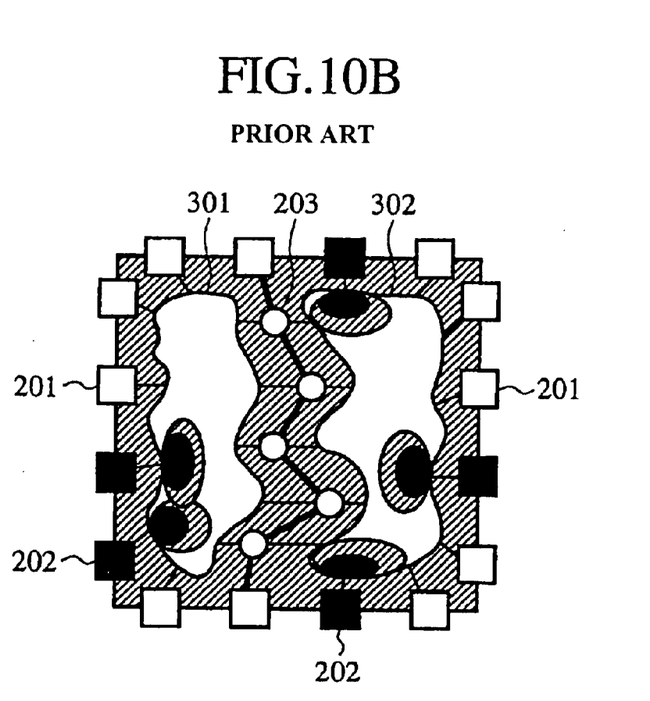

In such a case, the access routes to the pads and internal circuits of the LSI are apt to become major areas where the fault detection is to be abandoned. FIGS. 10A and 10B illustrate a concrete example of the above. In the drawing, 201 denotes a pad, 301 and 302 denote internal circuits such as combination circuits, and 203 denotes a scan shift register composed of plural SFFs. Smeared parts in FIG. 10B, which do not exist in the combination circuits in FIG. 10A, represent the areas where the fault detection is to be abandoned. In this manner, there is an inconvenience that the restriction of the accessible pin number will lead to an insufficient detection of the faults, with regard to the circuit areas to which unusable pins have been connected directly or indirectly.

Next, the conventional test operation of an LSI will be described with reference to the accompanying drawings.

Figure 11:
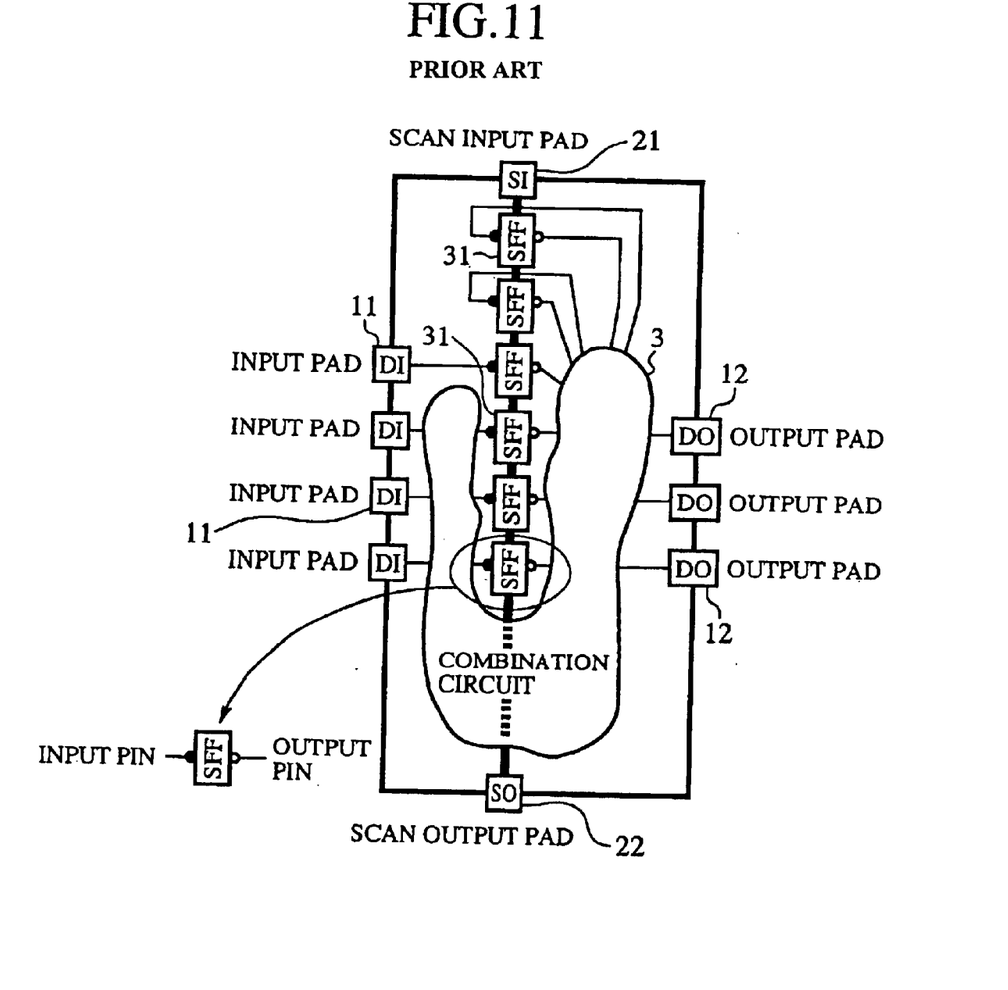
FIG. 11 is a block diagram of a conventional semiconductor integrated circuit device.
Figure 12:
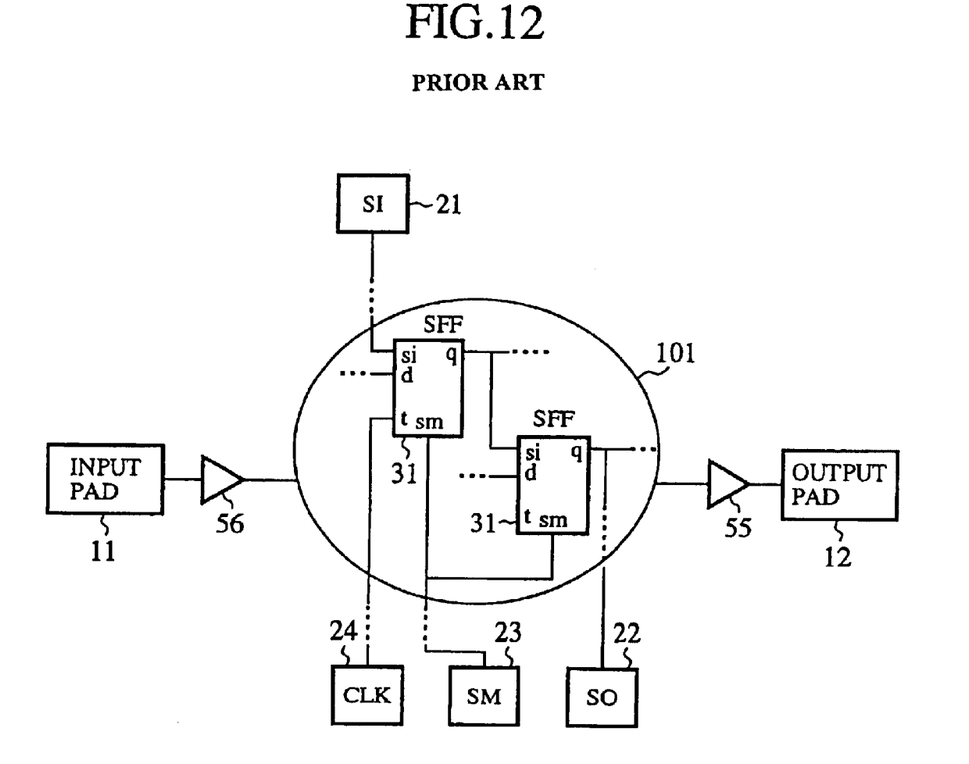
FIG. 12 is a circuit diagram of the conventional semiconductor integrated circuit device.

FIG. 11 and FIG. 12 are the block diagram and the circuit diagram of a conventional semiconductor integrated circuit device, respectively, and FIG. 12 represents the minimum circuit diagram to simplify the explanation. In the drawings, reference numeral 3 designates a combination circuit, 11 designates an input (DI) pad, 12 designates an output (DO) pad, and these pads are in charge of the interface between the LSI and the outside. Reference numeral 21 designates a scan input (SI) pad that enters a scan pattern, and 22 designates a scan output (SO) pad that delivers a scan out, that is, outputs a test result. Further, reference numeral 23 designates a scan mode (SM) pad that is used for the activation/deactivation control of a testing shift register (scan path), and 24 designates a testing clock (CLK) pad. Still further, reference numeral 31 designates a scan flip-flop (SFF), and consecutive SFFs constitute a testing shift register (scan path). Reference numerals 55 and 56 each designate an inverter, and 101 designates a circuit area including the combination circuit 3 and SFFs 31.

Next, the operation will be described by each step.

(1) The ATPG recognizes the testing clock (CLK), scan mode (SM), scan input (SI), scan output (SO), input pad (input pin), and output pad (output pin), and generates the test pattern.

(2) The ATPG treats the SM as, for example, 'L' level, and activates the scan path. At that moment, the input d to the SFF 31 (the input from the combination circuit during the normal operation) is invalidated, and the terminal si to each SFF is made valid.

(3) The pattern that the ATPG generates from the SI pad 21 propagates synchronously with the CLK on the scan path toward the SO pad 22.

(4) After completing the pattern setting to the SFF 31 located closest to the SO pad 22, the ATPG turns the SM into 'H' level.

(5) Further, applying the CLK to each SFF 31, the ATPG provides each SFF 31 with the response (test result) of the combination circuit to the test pattern that has been shifted in previously.

(6) Again, the ATPG turns the SM into 'L' level, executes the shift operation in the same manner as the steps (2) and (3), and takes out the test results sequentially from the SO pad 22. Generally at this stage, the next test pattern is shifted in simultaneously.

The above steps (1) through (6) are repeated, whereby the test is performed and completed.

The test pattern having shifted in performs the test of the circuit areas from the DI pad 11 to the input si of the SFF 31, from the output so (output q in the normal operation) to the output pad, and from the input si to the output so.

Since the conventional semiconductor integrated circuit device (LSI) is configured as above, there is a drawback that when testing plural LSIs at the same time in order to cut down the test cost per chip, the restriction due to the pins of the tester disables the access to all the pins of the LSI, thus lowering the fault coverage.

SUMMARY OF THE INVENTION

The present invention has been made in view of the foregoing circumstances, and it is an object of the invention to provide a semiconductor integrated circuit device that achieves the test using all the pins of the LSI, even when it has restrictions on the tester pin.

The semiconductor integrated circuit device according to the invention includes a combination circuit incorporated in a chip, plural input pads and output pads, and a shift register made up with plural SFFs, in which input pins and output pins that the SFFs each contain are connected, respectively, to the input pads and the output pads directly or via the combination circuit. With this configuration, the input pads and the output pads are connected to each other inside the chip, and a test path is made up.

In the semiconductor integrated circuit device according to the invention, the test path includes a path activation/deactivation control circuit that cuts off communications between the pads by the test path during the normal operation, and does not give any logical influences to the normal operation.

In the semiconductor integrated circuit device according to the invention, the output pads and the input pads constituting the test path are applicable to a pin inaccessible from a tester.

In the semiconductor integrated circuit device according to the invention, the path activation/deactivation control circuit includes a three-state buffer.

In the semiconductor integrated circuit device according to the invention, when the number of the output pads is fewer than that of the input pads in the output pads and the input pads that constitute the test path, a specific output pad is configured to connect to the plural input pads.

In the semiconductor integrated circuit device according to the invention, when the number of the output pads is more than that of the input pads in the output pads and the input pads that constitute the test path, the output pads are configured to connect to the input pads by way of a logical gate that executes a specific operational processing according to multiple inputs from the plural output pads.

The semiconductor integrated circuit device according to the invention applies bi-directional pads to either of the input pads and the output pads, and controls the input pads and the output pads by mutually different types of control signals.

In the semiconductor integrated circuit device according to the invention, when part of the input pads and the output pads are made up with the bi-directional pads, the inputs and outputs of the bi-directional pads are connected, respectively, to the concerned output pads and input pads.

DETAILED DESCRIPTION OF THE PREFERRED EMBODIMENTS

An embodiment of the present invention will be described below.

Embodiment 1

Figure 1:
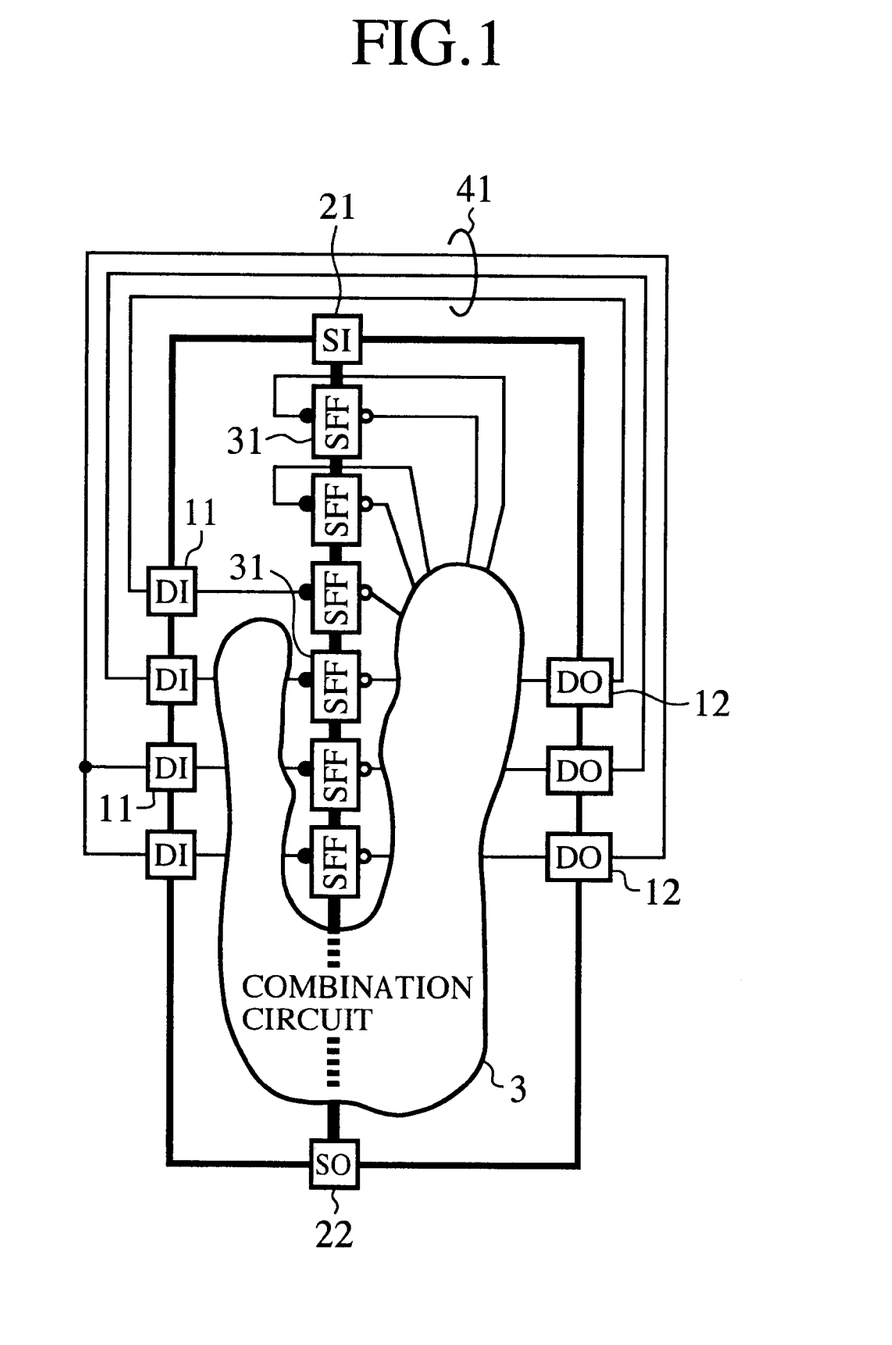
FIG. 1 is a block diagram of a semiconductor integrated circuit device according to an embodiment 1 of the present invention.
Figure 2:
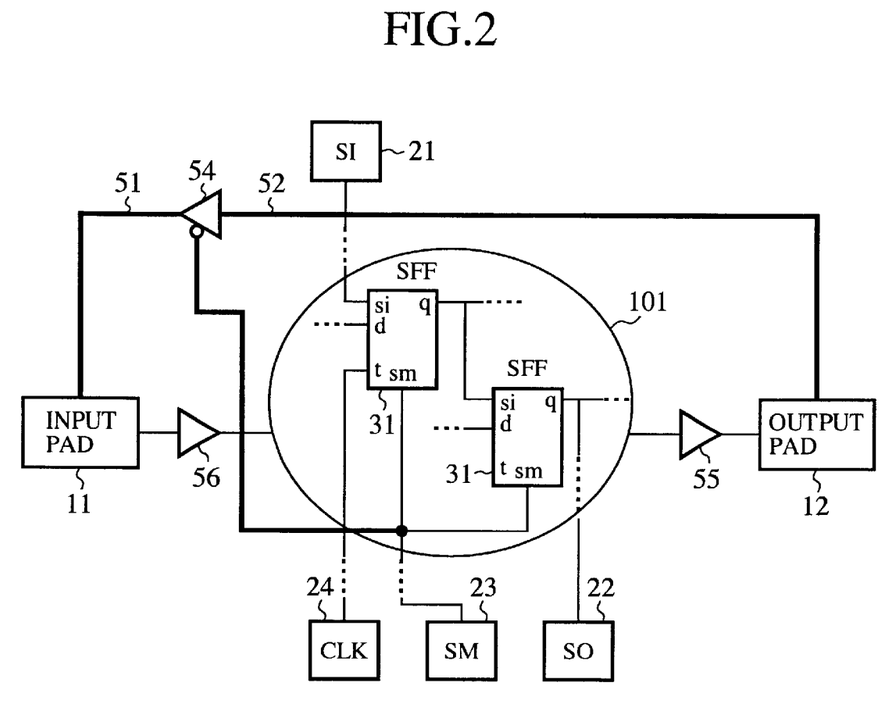
FIG. 2 is a circuit diagram of the semiconductor integrated circuit device according to the embodiment 1.

FIG. 1 is a block diagram of a semiconductor integrated circuit device according to an embodiment 1, and FIG. 2 is a circuit diagram of the embodiment 1. In the drawings, reference numeral 3 designates a combination circuit, 11 designates an input (DI) pad, 12 designates an output (DO) pad, and these DI and DO pads are in charge of the interface between an LSI and the outside. Reference numeral 21 designates a scan input (SI) pad that enters a scan pattern, and 22 designates a scan output (SO) pad that delivers a scan out, namely, outputs a test result. Further, reference numeral 23 designates a scan mode (SM) pad that is used for the activation/deactivation control of a testing shift register (scan path), and 24 designates a testing clock (CLK) pad. Reference numeral 31 designates a scan flip-flop (SFF), and consecutive SFFs constitute a testing shift register (scan path). Reference numeral 41 designates a test path, which is formed inside the LSI. Still further, 54 designates a three-state buffer, 55 and 56 each designate an inverter, and 101 designates a circuit area including the combination circuit 3 and SFFs 31.

The embodiment 1 has a feature of newly providing the test path 41 whereby the pad area of the LSI can be treated as one of the nodes inside a conventional logic circuit, which is a novel feature of this embodiment. Such a configuration is realized by forming the wirings that connect the DO pads 12 and the DI pads 11 inside the LSI, namely, inside the chip. This effects the following merits: Even if there is a pin being inaccessible directly from the tester (tester head), if a test path is formed which handles the pad as a node inside the circuit, it will generate a test pattern in a state that the tester head accesses all the input (DI) and output (DO) pins directly or indirectly inside the LSI.

Next, the operation will be described, referring to FIG. 2.

FIG. 2 illustrates the minimum circuit diagram as is required so as to clarify the explanation thereof. In an actual large-scale integrated circuit, the LSI is made up with a great majority of the pads, the SFFs (scan flip-flop or latch), and the combination circuits, and it can also include plural scan paths.

Now, the operation will be described by each step.

(1) An ATPG recognizes the testing clock (CLK), scan mode (SM), scan input (SI), scan output (SO), input pad (input pin), and output pad (output pin), and generates the test pattern.

(2) The ATPG treats the SM as, for example, L level, and activates the scan path. At that moment, the input d to the SFF 31 (the input from the combination circuit during the normal operation) is invalidated, and the terminal si to each SFF is made valid.

(3) The pattern that the ATPG generates from the SI pad 21 propagates synchronously with the CLK on the scan path toward the SO pad 22.

(4) After completing the pattern setting to the SFF 31 located closest to the SO pad 22, the ATPG turns the SM into H level.

(5) Further, applying the CLK to each SFF 31, the ATPG provides each SFF 31 with the response (test result) of the combination circuit to the test pattern that has been shifted in previously.

(6) Again, the ATPG turns the SM into L level, executes the shift operation in the same manner as the steps (2) and (3), and takes out the test results sequentially from the SO pad 22. Generally at this stage, the next test pattern is shifted in simultaneously.

The above steps (1) through (6) are repeated, whereby the test is performed and completed.

Now, if the input pad 11 in the drawings becomes the pin that is inaccessible from the tester because of the simultaneous measurement, the lowering in fault coverage can be avoided to a "specific level" by the test path as is shown by 51 to 54 in FIG. 2. In this case, the objects tested by the test pattern having shifted in are all the areas from the output SO to the input SI, except for the CLK pads, SM pads, SI pads, and SO pads. The output SO is the name of the SFF 31 during the test operation, which is the output q during the normal operation (refer to FIG. 2).

Further, the test path 41 is provided with the three-state buffer 54 so as not to give influences to the normal operation. Since the SM is put in H level during the normal operation, the value of the output pad 12 will not appear on the input pad 11. In other words, it becomes possible to set so that the control circuit controlling the activation/deactivation of the test path, furnished with the three-state buffer 54, cuts off the communications between the pads by the test path 41 during the normal operation, and does not give any logical influences to the normal operation.

The reason why the previous paragraph refers to the "specific level" lies in that the construction of the test path finishes a circuit having the output q of the SFF 31 as a starting point and the input d as a terminating point, whereby a means of accessing to all the circuit elements and nodes (test objects) is provisionally composed; however, in case the circuit diagram is extremely complicated, considerations must be paid to such relations that whether or not the test pattern can be obtained within realistic time, or whether or not the test generation time or the pattern quantity is conformable to the actual conditions; and even if the fault coverage is 100% in theory, it is a general practice to compromise the level within a feasible range.

Figure 3:
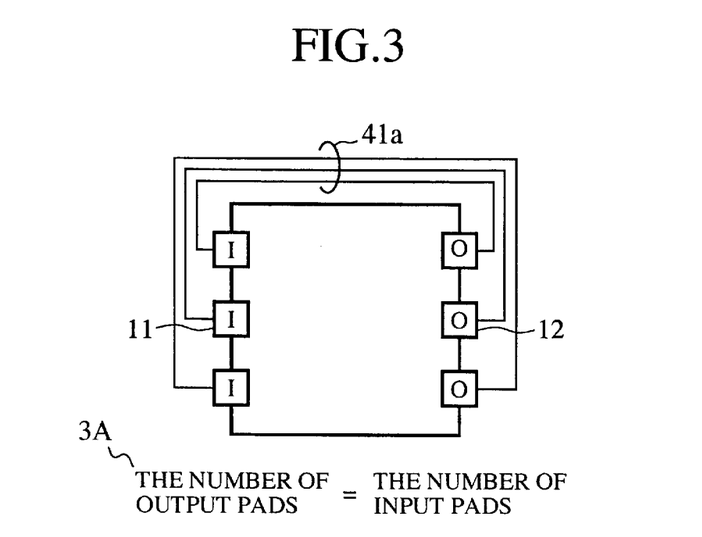
FIG. 3 is a test path connection diagram of the semiconductor integrated circuit device according to the embodiment 1.
Figure 4:
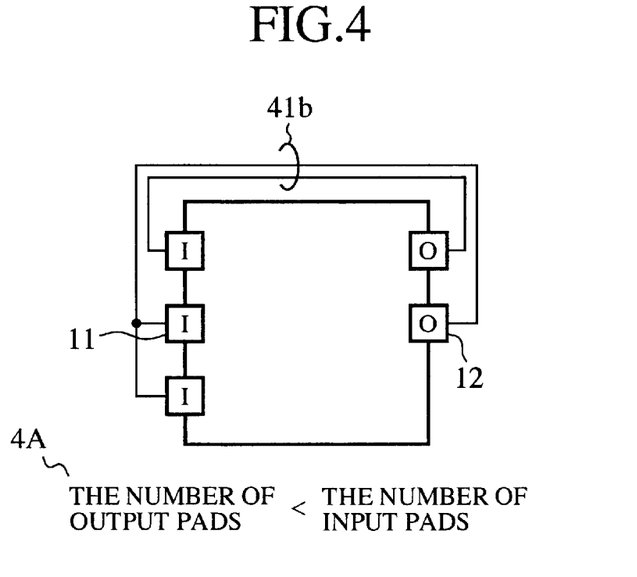
FIG. 4 is another test path connection diagram of the semiconductor integrated circuit device according to the embodiment 1.
Figure 5:
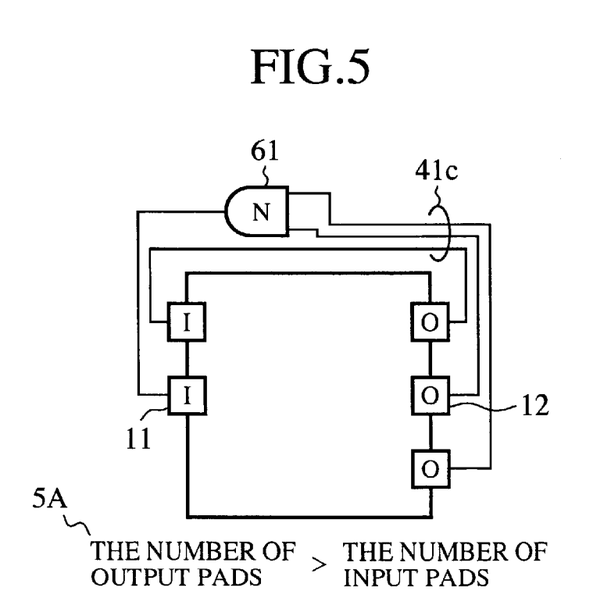
FIG. 5 is another test path connection diagram of the semiconductor integrated circuit device according to the embodiment 1.

Next, the relationship between the number of the output pads and that of the input pads will be discussed. Although this relationship has many variations depending on the LSI, it will simply be examined by classifying the case according to the size of the number of the pads. FIG. 3 illustrates a test path connection diagram, in which the number of the output pads is equal to that of the input pads. On the other hand, FIG. 4 illustrates the case where the number of the output pads is fewer than that of the input pads, and FIG. 5 illustrates the case contrary to the former. In these drawings, reference numerals 11 and 12 denote an input (DI) pad and an output (DO) pad, respectively, 41a to 41c each denote a test path, and 61 denotes a logic gate.

(a) First, in a case where the number of the output pads is equal to that of the input pads (the number of the output pads=the number of the input pads), all the wirings of the test path 41a can connect between the input pads 11 and the output pads 12 in one-to-one correspondence, and there is not any problem on the test generation by the ATPG (refer to FIG. 3).

(b) Next, in a case where the number of the input pads 11 is 3 and the number of the output pads 12 is 2 (the number of the output pads<the number of the input pads), the one-to-one connection can be made partially, but not to all the wirings, and the input pads 11 have vacancy. Accordingly, the connection is made from a specific output pad 12 to plural input pads 11 (refer to FIG. 4). The ATPG is applied to this state.

(c) In reverse to the above, in a case where the number of the input pads 11 is 2 and the number of the output pads 12 is 3 (the number of the output pads>that of the input pads), for example, if (the number of the output pads)−(the number of the input pads)=n (n: positive integer) is the case, an arrangement is made to appropriately make up an arbitrary logical gate 61 having (n+1) inputs and 1 output (for example, AND gate), and connect the output of this logical gate 61 to the input pad 11 (refer to FIG. 5). The ATPG is applied to this state.

However, in order to avoid influences to the input pattern during the normal operation, the three-state buffer that is inserted on the test path from the output pads 12 to the input pads 11 is made to maintain a high impedance state except for the test operation mode (refer to FIG. 2).

As mentioned above, according to the embodiment 1, by forming the test path inside the chip between the input pads and the output pads, whereby the pad portion of the LSI can be treated as one of the nodes inside the logic circuits, the number of the LSIs that can be measured simultaneously can be increased without lowering the fault coverage sharply, which effects the reduction of the test cost per LSI.

Embodiment 2

Figure 6:
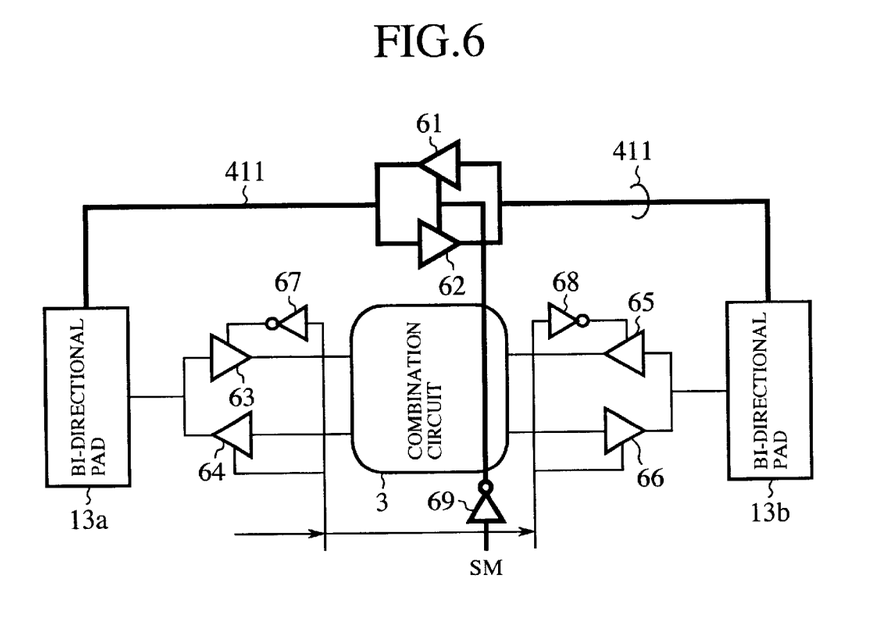
FIG. 6 is a circuit diagram of the semiconductor integrated circuit device according to an embodiment 2 of the invention.

FIG. 6 is a block diagram of a semiconductor integrated circuit device according to an embodiment 2 of the present invention. In the drawing, reference numeral 13a and 13b each denote a bi-directional pad, 61 to 66 each denote a 3-state buffer, 67 to 69 each denote an inverter, 411 denotes a test path, 101 denotes a circuit area provided with the combination circuit area and SFFs, and c1 and c2 are different types of control signals. The other configuration corresponds to FIG. 2, and overlapping parts are omitted in the figure. Since the circuit diagram in FIG. 6 is furnished with the bi-directional pads 13a, 13b, the number of the pins of the LSIs can be reduced, which is advantageous in avoiding the restriction due to the limit of the test pins.

Here, attentions must be paid in handling the bi-directional pads 13a and 13b. Basically, it is only needed to connect between the bi-directional pads 13a and 13b each other; however, in case the direction of the bi-directional pads 13a and 13b is controlled by the same control signal from the beginning, the connection of these pads to each other leads to impossibility of forming the propagation route of the test pattern. Therefore, it is necessary to first connect between the bi-directional pads 13a and 13b each other that are controlled by the originally different types of the control signals c1 and c2, followed by the application of the ATPG. Here, the test path 411 being functional as the path activation/deactivation control circuit requires two 3-state buffers 61 and 62.

The operation is the same as the embodiment 1, and the redundant explanation will be omitted. Although there is one precaution that the activation of the test path 411 requires applying the different types of control signals c1 and c2 to the bi-directional pads 13a and 13b, respectively, the test path 411 is activated when SM is in L level, and the input d (input from the combination circuit during the normal operation) to the SFFs is made invalid (refer to FIG. 1), whereby the test can be executed. On the other hand, the test path 411 is deactivated when SM is in H level, wherein the test is applicable to the normal operation. This is the same as the embodiment 1.

Figure 7:
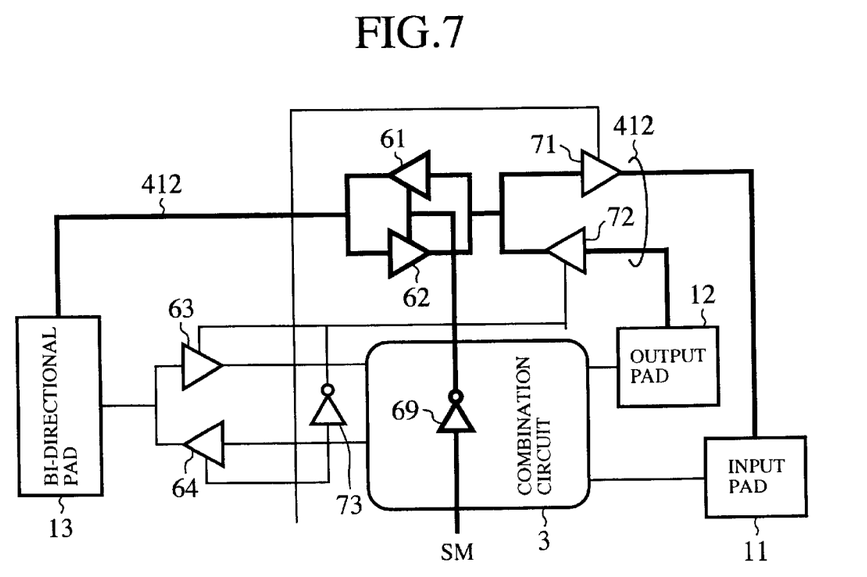
FIG. 7 is another circuit diagram of the semiconductor integrated circuit device according to the embodiment 2.

When the combination between the bi-directional pads as described above cannot be attained conveniently, the circuit diagram shown in FIG. 7 is conceivable. The above circuit includes the output pad 12 and the input pad 11 in place of the bi-directional pad 13b (whereas the bi-directional pad 13 equivalent to the bi-directional pad 13a remains as it is). The test path 412 being the path activation/deactivation control circuit additionally includes 3-state buffers 71 and 72, which are connected to the input and output pads 11 and 12. And, when the bi-directional pads 13, 13a and 13b are targeted for connections, it is necessary to control the activation/deactivation of the test path so that any of these connections do not give influences to the normal operation, and therefore the 3-state buffers are used.

Thus, according to the embodiment 2, by applying the bi-directional pads arbitrarily in place of the input pads and output pads, the all-pin access of the semiconductor integrated circuit device becomes still easier, and the test cost can be reduced while controlling the lowering in the fault coverage, which is an effect of the embodiment 2 in addition to the same effects as those in the embodiment 1.

As described above, according to this invention, the input pins and output pins with which the SFFs of the shift registers are provided are connected to the input pads and output pads, respectively, directly or via a combination circuit, and the output pads and input pads are connected to each other inside the chip to form the test path; therefore, even when there are restrictions on the tester pins, the test can be achieved which utilizes all the pins of a semiconductor integrated circuit device, and the simultaneous measurement of plural LSIs can be realized while the lowering in the fault coverage can be restrained, whereby the test cost per chip can be reduced.

According to the invention, the test path is designed to include a path activation/deactivation control circuit that cuts off the communications between the pads by the concerned test path during the normal operation, and does not give any logical influences to the normal operation; accordingly, the reliability to the normal operation can be enhanced in addition to the above effect.

According to the invention, since the output pads and input pads constituting the test path are made up to be applicable to the pins that the tester cannot access, the lowering in the fault coverage can further be restrained.

According to the invention, since the path activation/deactivation control circuit is made up to include the 3-state buffer, influences to the normal operation can be prevented by setting the 3-state buffer to a high impedance state except for the test operation.

According to the invention, since, in the output pads and the input pads that constitute the test path, when the number of the output pads is fewer than that of the input pads, a specific output pad is designed to be connected to the plural input pads, a sharp decrease in the fault coverage rate can be avoided.

According to the invention, since, in the output pads and the input pads that constitute the test path, when the number of the output pads is more than that of the input pads, the output pads are designed to connect to the input pads via a logical gate that executes a specific operational processing according to multiple inputs from the plural output pads, a sharp decrease in the fault coverage can be avoided in the same manner.

According to the invention, since the bi-directional pads are applied to either of the input pads and the output pads to control the input pads and the output pads by mutually different types of control signals, it is possible to reduce the number of the pads that the external tester is to access, and to increase the number of the LSIs to be simultaneously measured, while suppressing the lowering in the fault coverage; the test cost per chip can be cut down accordingly.

According to the invention, when part of the input pads and the output pads are made up with the bi-directional pads, the inputs and outputs of the bi-directional pads are designed to connect, respectively, to the concerned output pads and input pads. Therefore, if the bi-directional pads are not applicable to all the pads for the external interface, it will be possible to reduce to a certain level the number of the pads that the external tester is to access, and to increase the number of the LSIs to be simultaneously measured, while suppressing the lowering in the fault coverage.

What is claimed is:

1. A semiconductor integrated circuit device comprising:
  a combination circuit incorporated in a chip;

a plurality of input pads and output pads;

a shift register made up with a plurality of scan flip-flops (SFFs), in which input pins and output pins that the SFFs each include are connected, respectively, to the input pads and the output pads directly or via the combination circuit; and a test path formed inside the chip, the test path connecting all the input pads and the output pads to each other.

2. A semiconductor integrated circuit device according to claim 1, wherein the test path is provided with a path activation/deactivation control circuit that cuts off communications between the pads by the test path during a normal operation, which does not give any logical influences to the normal operation.

3. A semiconductor integrated circuit device according to claim 2, wherein the path activation/deactivation control circuit includes a three-state buffer.

4. A semiconductor integrated circuit device according to claim 1, wherein the output pads and the input pads constituting the test path are applicable to a pin inaccessible from a tester.

5. A semiconductor integrated circuit device according to claim 1, which applies bi-directional pads to either of the input pads and the output pads, and controls the input pads and the output pads by mutually different types of control signals.

6. A semiconductor integrated circuit device according to claim 1, wherein, when part of the input pads and the output pads are made up with bi-directional pads, the inputs and outputs of the bi-directional pads are connected, respectively, to the concerned output pads and input pads.

7. A semiconductor integrated circuit device comprising:

a combination circuit incorporated in a chip;

a plurality of input pads and output pads; and a shift register made up with a plurality of scan flip-flops (SFFs), in which input pins and output pins that the SFFs each include are connected, respectively, to the input pads and the output pads directly or via the combination circuit, wherein the input pads and the output pads are connected to each other inside the chip to construct a test path, and wherein, in the output pads and the input pads that constitute the test path, when the number of the output pads is fewer than that of the input pads, a specific output pad is configured to connect to the plural input pads.

8. A semiconductor integrated circuit device comprising:

a combination circuit incorporated in a chip;

a plurality of input pads and output pads; and a shift register made up with a plurality of scan flip-flops (SFFs), in which input pins and output pins that the SFFs each include are connected, respectively, to the input pads and the output pads directly or via the combination circuit, wherein the input pads and the output pads are connected to each other inside the chip to construct a test path, and wherein, in the output pads and the input pads that constitute the test path, when the number of the output pads is more than that of the input pads, the output pads are configured to connect to the input pads by way of a logical gate that executes a specific operational processing according to multiple inputs from the plural output pads.

* * * * *